US011882752B1

(12) United States Patent
Wang et al.

(10) Patent No.: US 11,882,752 B1
(45) Date of Patent: Jan. 23, 2024

(54) ELECTRONIC DEVICES WITH THROUGH-DISPLAY SENSORS

(71) Applicant: Apple Inc., Cupertino, CA (US)

(72) Inventors: Zhao Wang, Redwood City, CA (US); Alexis G. Soyseven, Santa Clara, CA (US); David S. Hum, Sunnyvale, CA (US); Graeme M. Williams, Santa Clara, CA (US); Ing-Jye Wang, Santa Clara, CA (US); Jae Won Choi, San Jose, CA (US); Jimmy H. Huang, Belmont, CA (US); Ming Xu, Cupertino, CA (US); Sungki Lee, Sunnyvale, CA (US); Timothy H. Ellis, San Jose, CA (US); Yu Cheng Chen, San Jose, CA (US); Yuchi Che, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 357 days.

(21) Appl. No.: 17/378,544

(22) Filed: Jul. 16, 2021

Related U.S. Application Data

(60) Provisional application No. 63/071,980, filed on Aug. 28, 2020.

(51) Int. Cl.

*H04M 1/02* (2006.01)
*H04B 1/03* (2006.01)

(Continued)

(52) U.S. Cl.

CPC .......... *H10K 59/60* (2023.02); *B32B 27/281* (2013.01); *B32B 37/12* (2013.01); *G01J 1/4204* (2013.01);

(Continued)

(58) Field of Classification Search

CPC ...... H10K 59/60; B32B 27/281; B32B 37/12; B32B 2307/416; B32B 2457/206;

(Continued)

(56) References Cited

U.S. PATENT DOCUMENTS 8,441,467 B2 * 5/2013 Han .................... G06F 3/0425 250/221
8,964,298 B2 2/2015 Haddick et al.

(Continued)

*Primary Examiner* — Andrew Wendell
(74) *Attorney, Agent, or Firm* — Treyz Law Group, P.C.; G. Victor Treyz; Joseph F. Guihan

(57) ABSTRACT

An electronic device display may have an active area with pixels. An optical sensor may be formed under a sensor region in the active area. During operation, ambient light and/or other light associated with the optical sensor may pass through the sensor region. To ensure that the light for the optical sensor can pass through the display, the display may have one or more layers with sensor openings such as a metal layer and a pressure sensitive adhesive layer that attaches the metal layer to the pixels of the display. To help minimize visibility of the openings in the sensor region, the pressure sensitive adhesive layer may be configured to have a reflectivity that matches the appearance of the display in the sensor region to surrounding areas. Undesired light output uniformity can be reduced by ensuring that the substrate material in the display has a low light absorption coefficient.

20 Claims, 5 Drawing Sheets

(51) Int. Cl.
*H04B 1/08* (2006.01)
*H10K 59/60* (2023.01)
*B32B 27/28* (2006.01)
*G01J 1/42* (2006.01)
*B32B 37/12* (2006.01)

(52) U.S. Cl.
CPC ... *B32B 2307/416* (2013.01); *B32B 2457/206* (2013.01)

(58) Field of Classification Search
CPC ........... G01J 1/4204; H04B 1/03; H04B 1/08; H04M 1/0266; H04M 1/0268; H04M 1/02; H04M 1/03
See application file for complete search history.

(56) References Cited

U.S. PATENT DOCUMENTS 9,001,280 B2 4/2015 Xu et al.
9,990,001 B2 6/2018 Mathew et al.
10,950,169 B2 3/2021 Yang
11,003,266 B2 * 5/2021 Kim ...................... G06F 3/0412
2011/0236617 A1 * 9/2011 Hong ...................... C08L 67/02 156/60
2013/0200913 A1 8/2013 Panagas
2015/0205442 A1 * 7/2015 Lin ...................... G06F 3/0425 345/175
2015/0219834 A1 8/2015 Nichol et al.
2018/0101270 A1 * 4/2018 Cho ...................... G06F 3/0446
2019/0011320 A1 * 1/2019 Pappalardo ......... G01M 5/0083
2019/0012007 A1 1/2019 Kim et al.
2019/0094069 A1 * 3/2019 Xu ...................... H05B 47/11
2019/0141224 A1 5/2019 Park
2019/0303640 A1 10/2019 Song et al.
2019/0324574 A1 10/2019 Schooley et al.
2020/0048505 A1 * 2/2020 Lee ...................... C09J 175/14
2020/0209055 A1 * 7/2020 Greimel-Längauer ...................... H03K 17/941
2020/0249489 A1 * 8/2020 Yen ...................... G02B 5/003
2020/0284883 A1 9/2020 Ferreira et al.
2020/0358027 A1 * 11/2020 Shin ...................... B32B 27/302
2020/0384734 A1 * 12/2020 Akisada ................ B32B 27/281
2021/0200366 A1 7/2021 Bok et al.
2021/0408170 A1 * 12/2021 Li ...................... H10K 59/126
2023/0267761 A1 * 8/2023 Chen .................. G06V 40/1324 382/124

* cited by examiner

ELECTRONIC DEVICES WITH THROUGH-DISPLAY SENSORS

This application claims the benefit of provisional patent application No. 63/071,980, filed Aug. 28, 2020, which is hereby incorporated by reference herein in its entirety.

FIELD

This relates generally to electronic devices, and, more particularly, to electronic devices with displays and sensors.

BACKGROUND

Electronic devices often have displays. Sensors are sometimes used in electronic devices to gather sensor readings. It can be challenging to accommodate both displays and sensors in electronic devices.

SUMMARY

An electronic device may be provided with a display. The display may have an active area with pixels configured to display an image for viewing by a user.

An optical sensor may be formed under a sensor region in the active area. During operation, ambient light and/or other light associated with the optical sensor may pass through the sensor region.

The display may have one or more layers with openings that are aligned with the optical sensor. For example, the display may have a metal plate that helps to support the pixels and may have a pressure sensitive adhesive layer that helps attach the pixels to the metal plate.

To ensure that the light for the optical sensor can pass through the display, the metal layer and the pressure sensitive adhesive layer may have openings aligned with the sensor area.

To help minimize visibility of the openings in the sensor region, the pressure sensitive adhesive layer may be configured to have a reflectivity that is closely matched to structures in the sensor region. In this way, light such as stray light emitted by the pixels of the display will tend to reflect with equal intensity from the sensor region and the pressure sensitive adhesive, making it difficult or impossible to visually discern any difference in appearance between the sensor region and other portions of the display.

Undesired light output variations from the pixels of the display can be reduced and display uniformity enhanced by ensuring that display substrate material in the display has a low

DETAILED DESCRIPTION

Electronic devices may be provided with displays. Displays may be used for displaying images for users. Displays may be formed from arrays of light-emitting diode pixels or other pixels. For example, a device may have an organic light-emitting diode display or a display formed from an array of micro-light-emitting diodes (e.g., diodes formed from crystalline semiconductor dies). The electronic devices may have sensors such as optical sensors that operate through the displays. This helps hide the sensors from view and allows inactive display borders to be minimized.

Figure 1:
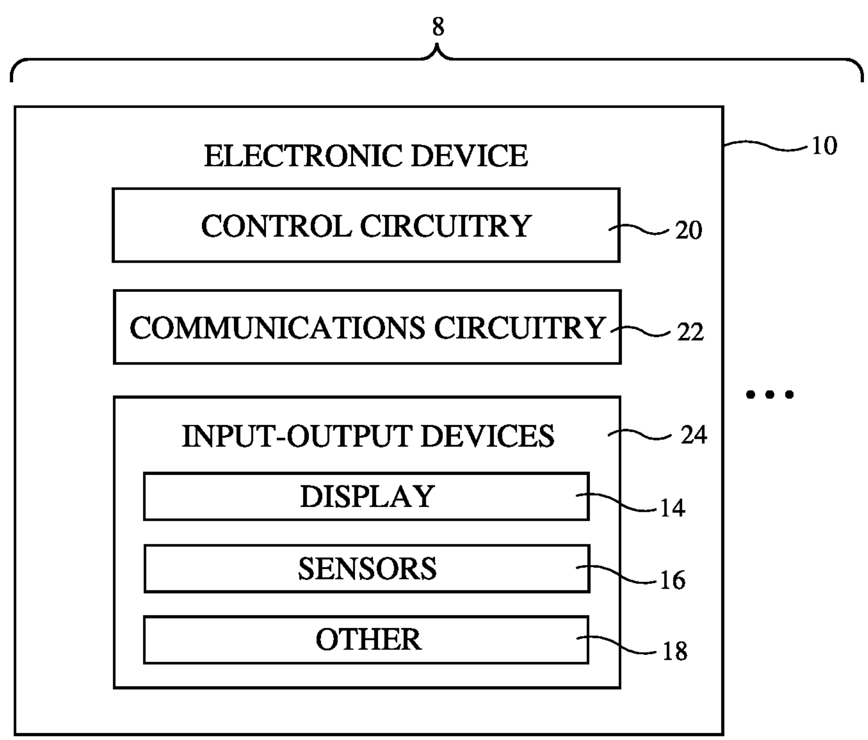
FIG. 1 is a schematic diagram of an illustrative electronic device in accordance with an embodiment.

A schematic diagram of an illustrative electronic device having one or more optical sensors that operate through a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a wristwatch, cellular telephone, tablet computer, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display or microLED display are sometimes described herein as an example.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
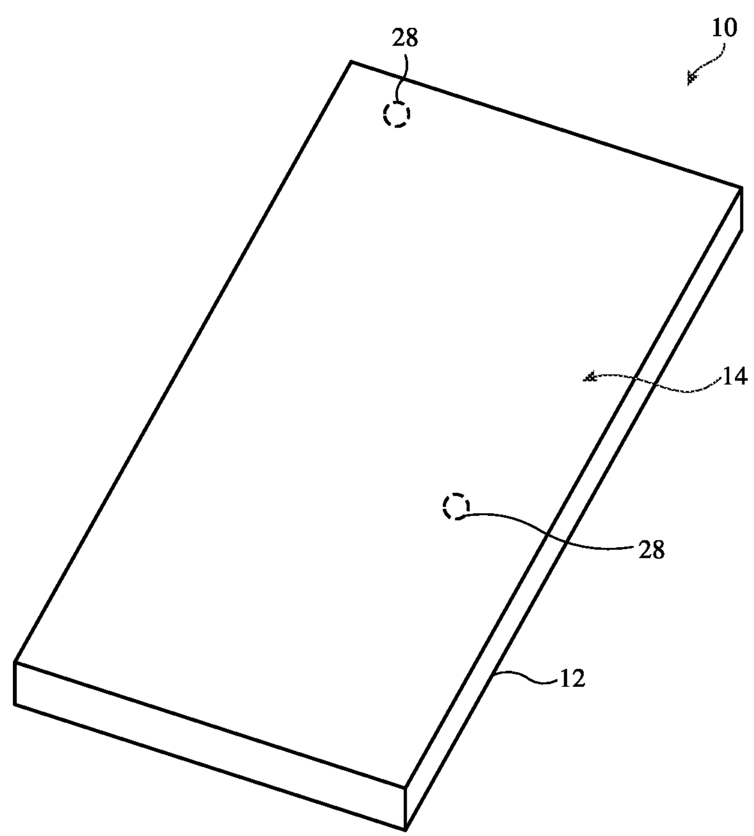
FIG. 2 is a perspective view of an illustrative electronic device in accordance with an embodiment.

FIG. 2 is a perspective view of electronic device 10 in an illustrative configuration in which device 10 is a portable electronic device such as a wristwatch, cellular telephone, or tablet computer. As shown in FIG. 2, device 10 may have a display such as display 14. Display 14 may cover some or all of the front face of device 10. Touch sensor circuitry such as two-dimensional capacitive touch sensor circuitry may be incorporated into display 14.

Display 14 may be mounted in housing 12. Housing 12 may form front and rear housing walls, sidewall structures, and/or internal supporting structures (e.g., a frame, midplate member, etc.) for device 10. Glass structures, transparent polymer structures, and/or other transparent structures that cover display 14 and other portions of device 10 may provide structural support for device 10 and may sometimes be referred to as housing structures or display cover layer structures. For example, a transparent housing portion such as a glass or polymer housing structure that covers and protects a pixel array in display 14 may serve as a display cover layer for the pixel array while also serving as a housing wall on the front face of device 10. The portions of housing 12 on the sidewalls and rear wall of device 10 may be formed from transparent structures and/or opaque structures.

Device 10 of FIG. 2 has a rectangular outline (rectangular periphery) with four corners. Device 10 may have other shapes, if desired (e.g., circular shapes, other shapes with curved and/or straight edges, etc.).

Display 14 may overlap one or more sensors 16. For example, display 14 may overlap optical sensors at locations such as illustrative sensor regions 28 of FIG. 2. Sensor regions 28 may be formed within the active area of display 14 (i.e., sensor regions 28 may overlap pixels in display 14 that are used to display images, rather than being located in inactive border regions of display 14).

The pixel structures of display 14 have gaps (e.g., gaps forming clear regions between metal traces and other opaque structures forming the pixel structures of display 14). Light may pass through these gaps in the pixels of display 14. As a result, the pixel structures in the active area of display 14 do not block light transmission. Display 14 may therefore be configured so that light passes through display 14. This light may include, for example, light emitted by sensors located under display 14 in regions 28 and ambient light present in the exterior region surrounding device 10. When displaying images, the pixels of display 14 emit light and some of this light (e.g., stray light) has an opportunity to pass through transparent portions of display 14 (e.g., portions of display 14 in sensor regions 28).

The light transmission of the pixel array forming display 14 may be, for example, at least 0.2%, at least 1%, at least 2%, at least 25%, at least 50%, at least 75%, less than 99.9%, less than 75%, or other suitable amount. Because the pixels of display 14 do not form a completely opaque light barrier, optical sensors that are located in the interior of device 12 under display 14 may emit light outwardly that passes through display 14 and reaches the exterior region surrounding device 10 and/or may detect light from the exterior region surrounding device 10 that passes through display 14 to the interior of device 10. These operations may be performed when some or all of the pixels of display 14 have been turned off or have been momentarily placed in a state in which they are not emitting light and/or may be performed when the pixels of display 14 are emitting light.

The optical sensors that operate through display 14 in this way may include infrared light-emitting devices (e.g., flood illuminators for infrared light sources), cameras (e.g., visible light image sensors and associated camera flashes, infrared cameras, etc.), optical proximity sensors such as proximity sensors that emit infrared light and detect the infrared light after the infrared light has reflected from external objects, three-dimensional sensors (e.g., infrared structured light sensors that include infrared image sensors and associated infrared light sources), time-of-flight sensors, lidar sensors, and/or other sensors that emit and/or detect light.

In an illustrative configuration, which may sometimes be described herein as an example, the optical sensors that are overlapped by display 14 in regions such as regions 28 of FIG. 2 may be monochrome ambient light sensors or color ambient light sensors. Ambient light sensors such as these may detect the amount of ambient light present in the vicinity of device 10. This information may be used to adjust screen brightness (e.g., to dim display 14 in dark ambient conditions and to brighten display 14 in bright lighting conditions) and/or to take other suitable action (e.g., adjusting display color cast based on ambient light color measurements, etc.).

Figure 3:
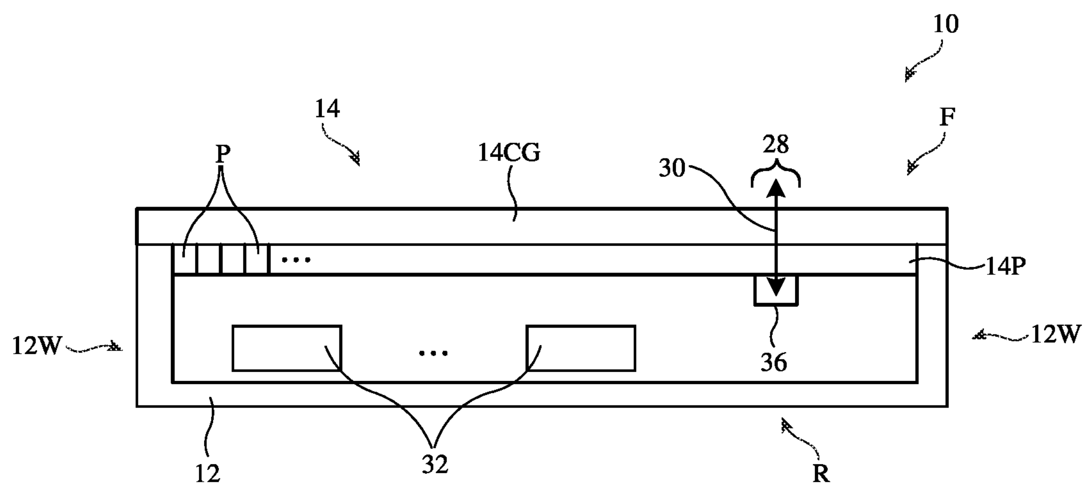
FIG. 3 is a cross-sectional side view of an illustrative electronic device in accordance with an embodiment.

FIG. 3 is a cross-sectional side view of device 10 of FIG. 2 taken through one of regions 28. As shown in FIG. 3, display 14 includes an array of pixels P forming display panel 14P under an inwardly facing surface of display cover layer 14CG. Display panel 14P may be, for example, a thin-film organic light-emitting diode display or a microLED display in which light-emitting pixels P are formed on a substrate layer (e.g., a layer of polyimide or a sheet of other polymer). Additional support for the pixel array of display 14 may be provided by a layer of metal (e.g., a housing midplate layer formed from metal or other metal layer that is coupled to the underside of display panel 14P). The metal supporting layer of display 14, which may be considered to form part of panel 14P or a separate layer that is coupled to panel 14P, may be coupled to the substrate layer of panel 14P by a layer of adhesive. An opening may be formed in the metal supporting layer and the layer of adhesive to allow light 30 in region 28 to pass through display 14 to or from an optical sensor. The optical sensor may be an optical sensor such as optical sensor 36 of FIG. 3 that is aligned with region 28 under display 14. Optical sensor 36 may be a color or monochrome ambient light sensor, image sensor, proximity sensor, and/or other optical sensor (e.g., one or more of sensors 16 of FIG. 1).

Display cover layer 14CG may be formed from polymer, glass, crystalline materials such as sapphire, other materials, and/or combinations of these materials. In the example of FIG. 3, housing 12 has a portion on rear face R that forms a rear housing wall and has side portions forming sidewalls 12W. The rear housing wall of housing 12 may form a support layer for components in device 10. Housing 12 may also have one or more interior supporting layers (e.g., frame structures) such as a metal midplate layer for supporting the array of pixels P in panel 14P. In the example of FIG. 3, display 14 is mounted on front face F of device 10. In general, display 14 may be mounted on any suitable portion of device 10. One or more sensors such as optical sensor 36 may be mounted under an active portion of display 14 (e.g., a portion of display 14 that includes pixels P for displaying images) and can transit and/or receive light 30 that passes through the pixels (e.g., through gaps between opaque metal traces and other opaque structures in the pixels). Electrical components 32 may be mounted in the interior of device 10 (e.g., between display 14 and the rear of housing 12. Components 32 may include circuitry of the type shown in FIG. 1 (e.g., control circuitry 20, communications circuitry 22, input-output devices 24, batteries, etc.).

Figure 4:
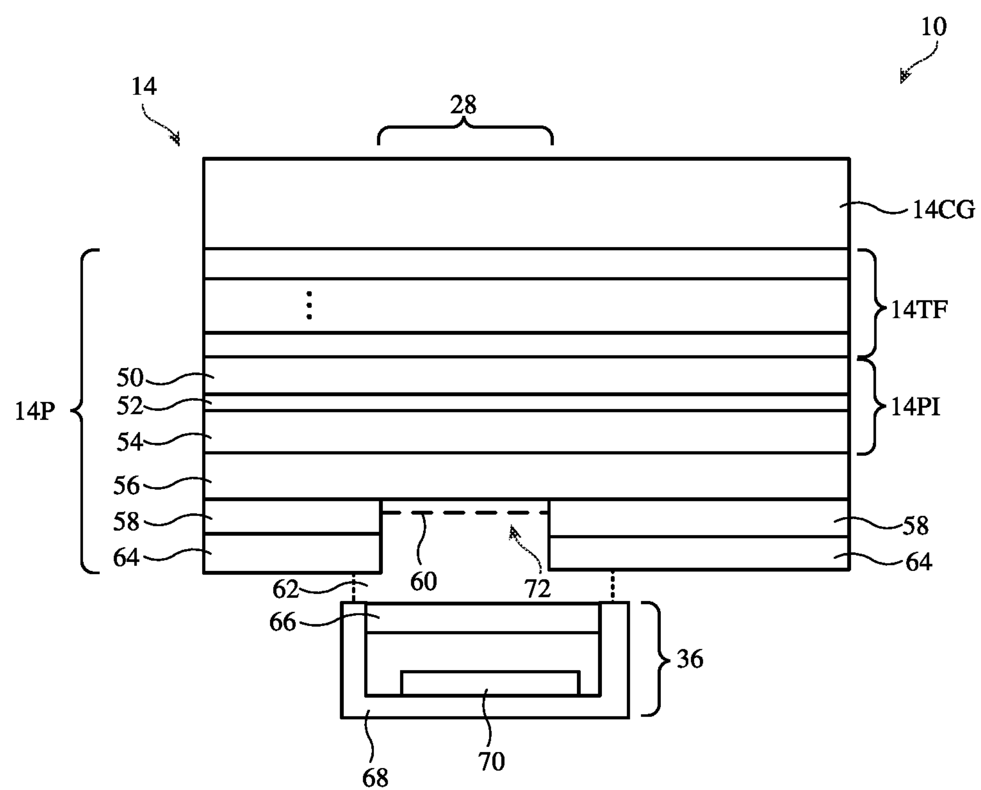
FIG. 4 is a cross-sectional side view of an illustrative display and sensor in accordance with an embodiment.

FIG. 4 is a side view of a portion of device 10 showing how display panel 14P may include a stack of display layers such as layers 14TF. Layers 14TF may include polarizer layers, thin-film encapsulation layers, layers of thin-film circuitry including pixel circuits for the pixels of panel 14P, light-emitting diodes for the pixels of panel 14P, and/or other display circuitry. Touch sensor circuitry may be included in layers 14TF (e.g., panel 14P may include a two-dimensional capacitive touch sensor).

Layers 14TF may be formed on substrate layer 14PI. Layer 14PI may be formed from polymer such as polyimide. In an illustrative configuration, which may sometimes be described herein as an example, substrate layer 14PI may include a first polyimide layer such as polyimide layer 54 and a second polyimide layer such as polyimide layer 50. A thin-film inorganic layer (e.g., a layer of a dielectric such as silicon oxide) may be formed between layers 56 and 54 to help block charge transport between layer 54 and 50.

During fabrication of display panel 14P, layer 14PI may be supported by a glass carrier. Following formation of the pixel array for panel 14P (e.g., the pixels formed from the circuitry of layers 14TF), a laser lift-off process or other removal process may be used to remove layer 14PI and layers 14TF from the glass carrier. These layers may then be attached to clear polymer support layer 56 (e.g., a layer of polyethylene terephthalate) by lamination under heat and/or pressure and/or by using an adhesive layer. Polymer support layer 56 may be attached to a metal support layer such as metal plate 64 using a layer of adhesive such as pressure sensitive adhesive layer 58. Metal plate 64, which may be, for example, a housing midplate or other metal supporting layer may be coupled to the inner surface of panel 14P and may therefore sometimes be considered to form part of panel 14P.

Optical sensor 36 may be mounted in the interior of device 10 in alignment with region 28. A sensor window opening may be formed in metal plate 64 such as opening 72. Opening 72 may also be formed in adhesive layer 58. The outline of opening 72 may be circular, rectangular, etc. By forming openings in pressure sensitive adhesive layer 58 and in metal plate 64, light may pass through region 28 of display 14 (e.g., light that is emitted by and/or sensed by sensor 36).

In the illustrative configuration of FIG. 4, sensor 36 is an ambient light sensor and includes semiconductor die 70. Die 70 may contain one or more photodetectors (e.g., photodetectors covered by color filters with different respective pass bands to provide sensor 36 with the ability to make spectral measurements). Die 70 may be formed from silicon and may be coupled to a flexible printed circuit or other signal path (e.g., so that control circuitry 20 of FIG. 1 may gather sensor data from sensor 36).

As shown in FIG. 4, die 70 may be mounted in package 68. Package 68 may, as an example, be formed from opaque polymer. Sensor window 66 may include light diffuser layers, filter layers, clear substrate layers and/or other optical films (e.g., clear polymer and/or glass structures, thin-film layers, etc.). Window 66 may be mounted in package 68 over die 70. During operation, light that is received by device 10 in region 28 (e.g., ambient light from the exterior of device 10) may pass into the interior of device 10 through display cover layer 14CG, through display layers 14TF, through substrate 14PI, through support layer 56, and through opening 72 in pressure sensitive adhesive layer 58 and metal pate 64. After passing through a gap (e.g., an air gap) between layer 56 and window 66, this light may then pass through window 66 into the interior of sensor 36 and may be measured by the photodetectors on die 70.

The ambient light that passes through display cover layer 14CG and light that is emitted by the pixels of layers 14TF illuminates the surface of pressure sensitive adhesive layer 58 and illuminates opening 72. The light illuminating these areas of display 14 may potentially exhibit different amounts of reflection. Illumination that reaches the interface between polymer support layer 56 and pressure sensitive adhesive 58 may be reflected at a first level (e.g., reflectivity R1). Illumination that reaches the interface at the lower surface of layer 56 (e.g., the air-to-polymer interface at the innermost surface of polymer support layer 56 in opening 72) may be reflected at a second level (e.g., reflectivity R2). If care is not taken, a mismatch between the magnitudes of R1 and R2 may make the presence of opening 72 visible to a user viewing display 14. For example, opening 72 may appear dark while surrounding portions of display 14 outside of region 28 may appear light or vice versa.

To help avoid undesirable visual artifacts such as these as a user is viewing images on display 14, the reflectivity of pressure sensitive adhesive 58 may be selected so that the values of R1 and R2 are closely matched (e.g., so that R1 differs from R2 by less than 35%, less than 25%, less than 15%, less than 10%, less than 5%, or other suitable amount). Pressure sensitive adhesive 58 may also be provided with a neutral color (e.g., gray rather than a non-neutral color such as blue). In an illustrative embodiment, this may be accomplished by forming pressure sensitive adhesive 58 from a gray polymer material such as a gray pressure sensitive adhesive characterized by a reflectivity R1 of 5-35%, 5-40%, 5-15%, at least 7%, 7-13%, 10-20%, at least 5%, at least 10%, at least 20%, at least 30%, 35%, less than 65%, or other suitable reflectivity value that helps to minimize the difference between the values of R1 and R2. Using dark gray pressure sensitive adhesive in display 14 rather than other colors of pressure sensitive adhesive (e.g., rather than white or black pressure sensitive adhesive as examples) may help enhance the appearance of display 14 by reducing visual artifacts on display 14.

In some configurations, it may be desirable to help minimize the value of R2 in opening 72 (e.g., to allow a darker pressure sensitive adhesive material to be used in forming pressure sensitive adhesive 58 and thereby helping to suppress stray light). This may be accomplished by including antireflection layer 60 on the innermost surface of polymer support layer 56 in opening 72 or by incorporating index-matching material 62 that spans the gap between the lowermost surface of layer 56 and the uppermost layer of window 66. Incorporating these structures to reduce the reflectivity of region 28 allows the reflectivity of layer 58 to be reduced elsewhere (if desired) while still avoiding undesired visual artifacts.

Antireflection layer 60 may be an antireflection coating formed from one or more layers of clear dielectric material (e.g., polymer, inorganic dielectric layer(s), etc.). If desired, antireflection layer 60 may include a stack of thin-film dielectric layers with alternating refractive index values that are configured to form a thin-film interference filter antireflection coating. Index-matching material 62, which may be, for example, an ultraviolet-light-cured adhesive (e.g., optically clear adhesive) such as an ultraviolet-light-cured epoxy or other transparent polymer adhesive, may have a refractive index value that matched to (or has an intermediate value between) the refractive index values of layer 58 and window 66. Index matching may be accomplished by ensuring that these index values differ by less than 0.15, less than 0.1, less than 0.05, less than 0.025 or other suitable matching criteria. The use of index-matching material may help suppress reflections at the interface between layer 56 and material 62 and/or at the interface between material 62 and window 66 (e.g., less light will be reflected from these interfaces than in scenarios in which material 62 is not present and the gap between the lower surface of layer 56 and the opposing upper surface of window 66 is filled with air).

Because light passes through polyimide layer 14PI during operation of display 14, there is a risk that some of this light will be absorbed in layer 14PI. Light absorbed in layer 14PI (e.g., light absorbed in layer 50) may create photo-induced electrical charge. This charge can create electric fields that affect the voltages on the circuitry of layers 14TF (e.g., the photo-induced charge may impact the amount of current flowing through transistors in layer 14TF and the associated amount of light emitted by the light-emitting diodes of the pixels of layer 14TF). The photo-induced charge may therefore represent a potential source of undesirable variations in the output of the pixels in display panel 14P across the surface of display 14. To avoid these undesirable brightness variations while operating display 14, the amount of light absorption exhibited by layer 14PI (e.g., the absorption of layer 50) may be maintained at a suitably low level.

Figure 5:
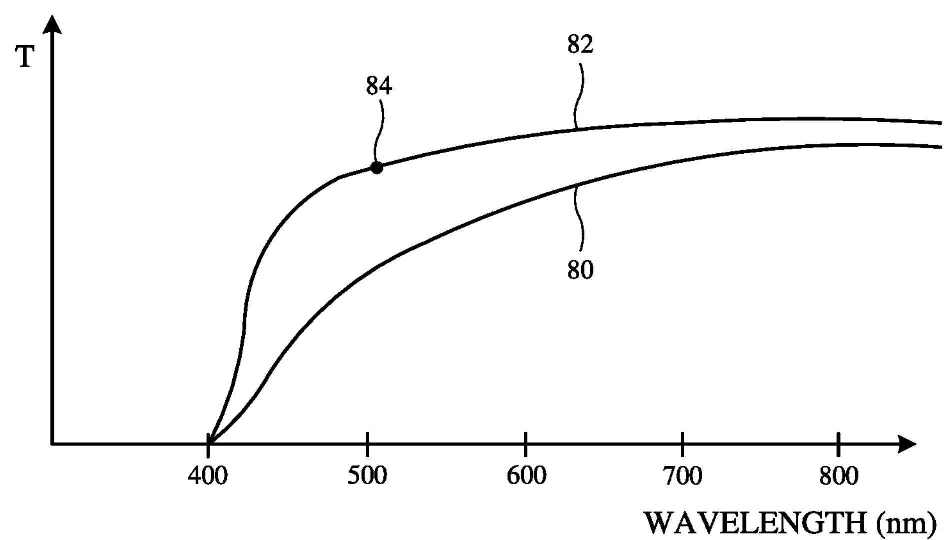
FIG. 5 is a graph in which light transmission through a pair of illustrative display substrate layers has been plotted as a function of wavelength in accordance with an embodiment.

To help increase the light transmission of layer 14PI and thereby reduce light absorption and photo-induced charge creation in layer 14PI, layer 14PI may be configured to exhibit a relatively large amount of light transmission. FIG. 5 is a graph in which light transmission for an illustrative polyimide layer (e.g., layer 14PI) with a thickness of 10 microns has been plotted as a function of wavelength for two illustrative types of polyimide. The first type of polyimide is formed using higher-temperature curing temperatures and results in a transmission characteristic of the type shown by curve 80. The second type of polyimide is formed using reduced-temperature curing (curing for a longer period of time at a temperature below the higher-temperature used in curing the first type of polyimide). The low-temperature-cured polyimide layer may be characterized by a light transmission characteristic of the type shown by curve 82. In this example, the light transmission T of layer 14PI at a wavelength of 500 nm is represented by a relatively high value (point 84 on curve 82). The light transmission T at point 84 may be, for example, at least 55%, at least 60%, at least 65%, at least 70%, or at least 75% when the polyimide layer thickness is 10 microns.

Polyimide layers with different thicknesses will exhibit different amounts of light transmission. Equation 1 represents the intensity I of light after passing through a layer of polyimide of thickness d. In equation 1, intensity I0 is the intensity of light entering the polyimide layer and μ is the absorption coefficient for the polyimide material.

$$I = I0 \exp(-\mu d) \quad (1)$$

Transmission T through the layer of polyimide of thickness d is equal to I/I0. For satisfactory display output uniformity, T is preferably at least 55%, at least 65%, at least 75%, or 55-75% (as examples) in a layer of polyimide where d is equal to 10 microns. Solving for absorption coefficient μ using equation 1, these preferable values correspond to values of μ of less than $5.98\times10^4$ $m^{-1}$ (at least 55% transmission), less than $4.31\times10^4$ $m^{-1}$ (at least 65% transmission), $2.88\times10^4$ $m^{-1}$ (at least 75% transmission), and 5.98 to $2.88\times10^4$ $m^{-1}$ (55-75% transmission).

Some or all of the polyimide material used in forming layer 14PI (e.g., polyimide layer 50 and polyimide layer 54) may have these preferred optical absorption characteristics to help ensure satisfactorily low levels of photo-induced charge in layer 14PI and thereby ensure satisfactory display output uniformity. Satisfactory display uniformity characteristics may be achieved by using polyimide with these preferred absorption coefficient values in any suitable displays including displays 14 that include optional antireflection layer 60, optional index-matching material 62, and/or that use material such as dark gray polymer for forming pressure sensitive adhesive layer 58 that exhibits a reflectivity R1 of 5-15%, 5-35%, 5-40%, at least 7%, 7-13%, 10-20%, at least 5%, at least 10%, at least 20%, at least 30%, 35%, less than 65%, or other suitable reflectivity value for minimizing appearance differences between region 28 of display 14 and other regions of display 28.

The foregoing is merely illustrative and various modifications can be made to the described embodiments. The foregoing embodiments may be implemented individually or in any combination.

What is claimed is:

1. An electronic device, comprising:

a housing;

a display mounted in the housing, wherein the display has an active area with pixels configured to display an image; and an optical sensor under a sensor region in the active area, wherein the optical sensor is configured to receive light through the sensor region, wherein the display comprises a layer of adhesive having a reflectivity configured to help visually match the sensor region to surrounding portions of the display, and wherein the reflectivity is 5-35%.

2. The electronic device defined in claim 1 wherein the display comprises a metal plate with an opening aligned with the sensor region, wherein the layer of adhesive is between the pixels and the metal plate.

3. The electronic device defined in claim 2 further comprising a layer of polyimide between the pixels and the layer of adhesive, wherein the layer of polyimide is characterized by an absorption coefficient of less than $5.98\times10^4$ $m^{-1}$.

4. The electronic device defined in claim 3 wherein the layer of polyimide is characterized by an absorption coefficient of less than $4.31\times10^4$ $m^{-1}$.

5. The electronic device defined in claim 1 further comprising:

a substrate layer on which the pixels are formed;

a polymer layer between the substrate layer and the layer of adhesive; and an antireflection layer on the polymer layer in the sensor region, wherein the antireflection layer is between the polymer layer and the optical sensor.

6. The electronic device defined in claim 1 further comprising:

a substrate layer on which the pixels are formed;

a polymer layer between the substrate layer and the layer of adhesive, wherein the sensor comprises a sensor window formed from clear material; and a layer of index matching material that contacts the polymer layer and that contacts the sensor window.

7. The electronic device defined in claim 1 wherein the adhesive layer comprises a layer of gray pressure sensitive adhesive.

8. The electronic device defined in claim 7 wherein the optical sensor comprises an ambient light sensor.

9. The electronic device defined in claim 1 wherein the pixels comprise organic light-emitting diode pixels, wherein the optical sensor comprises an ambient light sensor, and wherein the adhesive layer comprises a layer of pressure sensitive adhesive.

10. The electronic device defined in claim 1 further comprising a layer of polyimide between the pixels and the layer of adhesive, wherein the layer of polyimide is characterized by an absorption coefficient of less than $4.31\times10^4$ $m^{-1}$.

11. An electronic device, comprising:

a display having pixels that form an active area in which an image is displayed;

a display cover layer that overlaps the pixels, wherein the display has a sensor region within the active area that overlaps some of the pixels;

a metal layer configured to support the display, wherein the metal layer has a hole in the sensor region;

an adhesive layer with a hole in the sensor region, wherein the adhesive layer is configured to help reduce visibility of the hole in the metal layer; and an ambient light sensor configured to receive ambient light that has passed through the display cover layer, through the pixels in the sensor region, and through the holes in the metal layer and the adhesive layer.

12. The electronic device defined in claim 11 further comprising a polyimide substrate layer between the pixels and the adhesive layer, wherein the polyimide substrate layer has an absorption coefficient of less than $4.31\times10^4$ $m^{-1}$.

13. The electronic device defined in claim 12 wherein the adhesive layer comprises a gray pressure sensitive adhesive layer.

14. The electronic device defined in claim 13 wherein the adhesive layer has a reflectivity of at least 5%.

15. The electronic device defined in claim 11 wherein the adhesive layer comprises a pressure sensitive adhesive layer with a reflectivity of at least 7%.

16. The electronic device defined in claim 11 further comprising:

a substrate layer on which the pixels are formed;

a polymer layer between the substrate layer and the adhesive layer; and an antireflection layer on the polymer layer in the sensor region, wherein the antireflection layer is between the polymer layer and the ambient light sensor.

17. An apparatus, comprising:

a layer of pixels configured to display an image;

a sensor configured to measure ambient light passing through the layer of pixels;

a metal layer configured to support the layer of pixels; and a pressure sensitive adhesive layer between the metal layer and the layer of pixels that has a reflectivity of at least 7%.

18. The apparatus defined in claim 17 wherein the sensor comprises a color ambient light sensor and wherein the pixels comprise organic light-emitting diode pixels formed on a polyimide substrate.

19. The electronic device defined in claim 18 wherein the polyimide substrate is between the pixels and the pressure sensitive adhesive layer and wherein the polyimide substrate has an absorption coefficient of less than $5.98\times10^4$ $m^{-1}$.

20. The electronic device defined in claim 17 further comprising:

a substrate layer on which the layer of pixels is formed;

a polymer layer between the substrate layer and the pressure sensitive adhesive layer; and an antireflection layer on the polymer layer, wherein the antireflection layer is between the polymer layer and the sensor.

* * * * *